United States Patent
Dinh et al.

(10) Patent No.: US 8,159,269 B2
(45) Date of Patent: Apr. 17, 2012

(54) MULTI-FUNCTION INPUT TERMINAL OF INTEGRATED CIRCUITS

(75) Inventors: Quang Khanh Dinh, Hungyen Provine (VN); Gary M. Hurtz, Shanghai (CN); Steven Huynh, Fremont, CA (US)

(73) Assignee: Active-Semi, Inc. (VG)

( * ) Notice: Subject to any disclaimer, the term of this patent is extended or adjusted under 35 U.S.C. 154(b) by 958 days.

(21) Appl. No.: 12/217,161

(22) Filed: Jul. 2, 2008

(65) Prior Publication Data

US 2010/0001761 A1      Jan. 7, 2010

(51) Int. Cl.
*H03K 17/16* (2006.01)
*G06F 1/16* (2006.01)

(52) U.S. Cl. ............... 326/82; 326/56; 326/58; 326/30; 713/320; 713/330

(58) Field of Classification Search ............... 326/58, 326/56; 307/115, 140; 713/320, 330, 340
See application file for complete search history.

(56) References Cited

U.S. PATENT DOCUMENTS

| | | | | |
|---|---|---|---|---|
| 6,148,398 A | * | 11/2000 | Chang et al. | 713/1 |
| 7,741,870 B2 | * | 6/2010 | Hurtz et al. | 326/82 |
| 7,847,441 B2 | * | 12/2010 | Tatsumi et al. | 307/140 |
| 2009/0033363 A1 | * | 2/2009 | Hurtz et al. | 326/57 |
| 2009/0200982 A1 | * | 8/2009 | Hurtz | 320/103 |

* cited by examiner

*Primary Examiner* — Vibol Tan
(74) *Attorney, Agent, or Firm* — Imperium Patent Works; Zheng Jin; Darien K. Wallace

(57) ABSTRACT

A single terminal is used to configure an integrated circuit into one of three states. A circuit within the integrated circuit is coupled to the terminal and determines whether the terminal: 1) is coupled by a low impedance to a voltage source, or 2) is coupled by a medium impedance to the voltage source, or 3) is floating or substantially floating. The circuit asserts a first digital logic signal when the circuit determines that the terminal is coupled by the low impedance to the voltage source. The circuit asserts a second digital logic signal when the circuit determines that the terminal is coupled by the medium impedance to the voltage source. The circuit asserts a third digital logic signal when the circuit determines that the terminal is floating or substantially floating. The terminal and circuit are particular suited for use in a Power Management Unit (PMU) Integrated Circuit.

24 Claims, 6 Drawing Sheets

| TWO SWITCHES | | TWO TERMINALS | | |
|---|---|---|---|---|
| A | B | T1 | T2 | FUNCTION |
| PUSHED | PUSHED | 0 | 0 | HARD RESET |
| PUSHED | RELEASED | 0 | 1 | HARD RESET |
| RELEASED | PUSHED | 1 | 0 | ENABLE/DISABLE |
| RELEASED | RELEASED | 1 | 1 | IDLE |

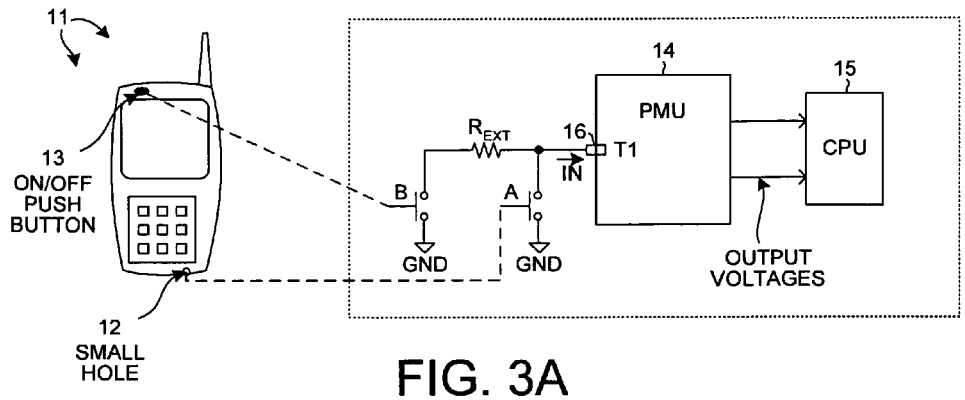
FIG. 3A
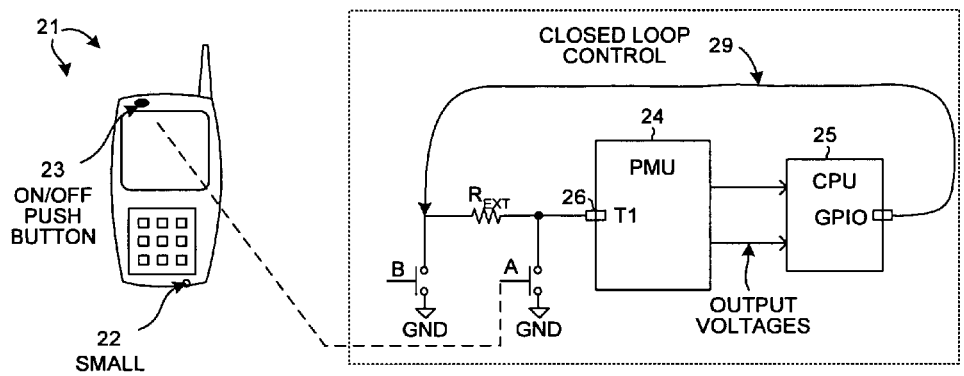
FIG. 3B
| TWO INPUTS | | ONE TERMINAL | THREE FUNCTIONS |
|---|---|---|---|
| A | B | T1 (IN) | FUNCTION |
| PUSHED | PUSHED | 0 | HARD RESET |
| PUSHED | RELEASED | | |
| RELEASED | PUSHED | R | ENABLE/DISABLE |
| RELEASED | RELEASED | FLOATING | IDLE |
FIG. 4

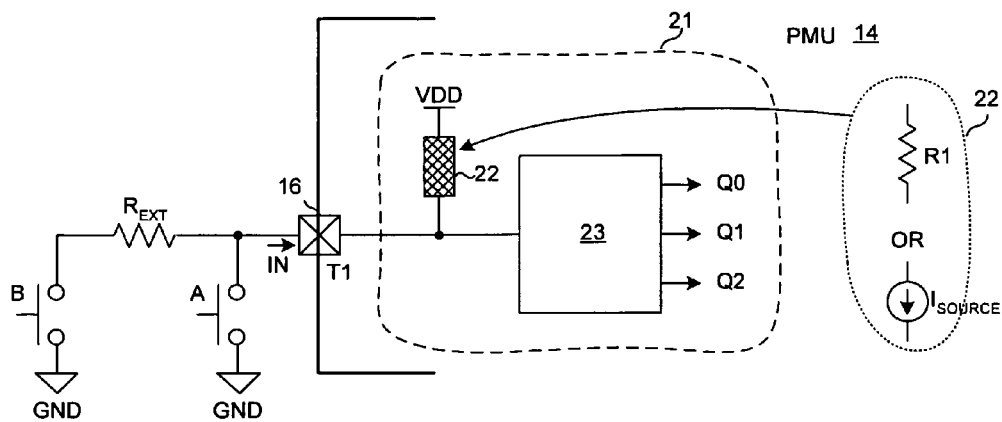
FIG. 5
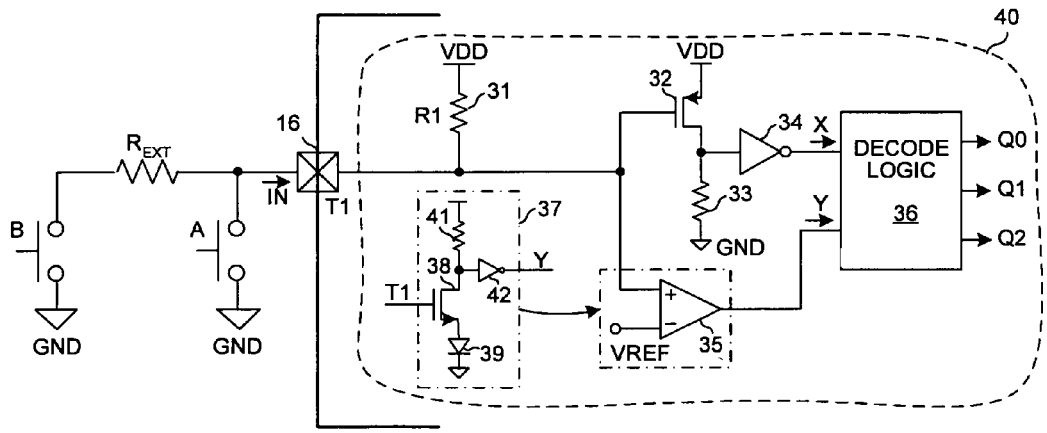
FIG. 6
| TWO INPUTS | | ONE TERMINAL | TWO OUTPUTS | | THREE STATES | THREE FUNCTIONS |
|---|---|---|---|---|---|---|
| A | B | T1(IN) | X | Y | STATE | FUNCTION |
| PUSHED | PUSHED | 0 | 0 | 0 | Q0 | HARD RESET |
| PUSHED | RELEASED | 0 | 0 | 0 | Q0 | HARD RESET |
| RELEASED | PUSHED | R | 0 | 1 | Q1 | ENABLE/DISABLE |
| RELEASED | RELEASED | 1 | 1 | 1 | Q2 | IDLE |
FIG. 7

| TWO INPUTS | | ONE TERMINAL | | TWO OUTPUTS | | THREE STATES | THREE FUNCTIONS |
|---|---|---|---|---|---|---|---|
| A | B | T1 | I | V | X | Y | STATE | FUNCTION |
| PUSHED | PUSHED | 1 | LARGE | 0 | 0 | 0 | Q0 | HARD RESET |
| PUSHED | RELEASED | 1 | LARGE | 0 | 0 | 0 | Q0 | HARD RESET |
| RELEASED | PUSHED | R | R | R | 0 | 1 | Q1 | ENABLE/DISABLE |
| RELEASED | RELEASED | FLOAT | SMALL | 1 | 1 | 1 | Q2 | IDLE |

MULTI-FUNCTION INPUT TERMINAL OF INTEGRATED CIRCUITS

TECHNICAL FIELD

The present disclosure relates generally to terminals of integrated circuits, where the terminals are used to receive configuration information that configures circuitry within the integrated circuit.

BACKGROUND

FIG. 1 (Prior Art) is a simplified diagram of a cellular telephone 1 having a Power Management Unit (PMU) 4 and a Central Processing Unit (CPU) 5. As illustrated in FIG. 1, cellular telephone 1 includes a small hole 2 and an ON/OFF push button 3. PMU 4 includes two input terminals T1 and T2. T1 and T2 are coupled externally to a supply voltage VDD by resistors R1 and R2 respectively. Small hole 2 contains a switch A that couples terminal T1 of PMU 4 to a digital logic low voltage GND when switch A is closed. ON/OFF push button 3 controls a switch B that couples terminal T2 of PMU 4 to the digital logic low voltage GND when switch B is closed. During normal operation, PMU 4 outputs supply voltages to CPU 5. A user may either press switch A inside small hole 2 to reset the cellular telephone or push ON/OFF push button 3 to enable/disable the cellular telephone.

FIG. 2 (Prior Art) is a table 9 that illustrates how cellular telephone 1 of FIG. 1 is configured through the use of two input terminals T1 and T2 of PMU 4. If cellular telephone 1 somehow malfunctions, then the user presses switch A inside small hole 2. Switch A closes and causes terminal T1 to be coupled to GND (T1 is denoted "0" in table 9). In response, PMU 4 outputs a first digital logic signal to reset CPU 5. On the other hand, if cellular telephone 1 is functioning properly, switch A remains open and the user uses ON/OFF push button 3 to either enable or disable the cellular telephone. In the example of FIG. 2, if the user pushes ON/OFF push button 3, then switch B closes and causes terminal T2 to be coupled to GND (T2 is denoted "0" in table 9). In response, PMU 4 outputs a second digital logic signal either to enable CPU 5 (if CPU 5 is previously disabled) or to disable CPU 5 (if CPU 5 previously is enabled). During normal operation, both switches A and B are released and terminals T1 and T2 have a digital logic high-voltage (T1 and T2 are denoted "1" in table 9). In response, PMU 4 outputs a third digital logic signal and remains in an idle state. As illustrated in FIG. 2, switch A has a higher priority over switch B. As long as switch A is pushed close, PMU 4 outputs the first digital logic signal to reset CPU 5 regardless whether switch B is pushed or released. However, two input terminals T1 and T2 are required for PMU 4 to be able to detect whether switch A and/or switch B is either pushed or released. PMU 4 then outputs a corresponding digital logic signal to either reset CPU 5 or enable/disable CPU 5. Improvements to the above-described PMU 4 are desired.

SUMMARY

A single input terminal is used to configure an integrated circuit into one of three states. A circuit within the integrated circuit is coupled to the terminal and determines whether the terminal: 1) is coupled by a low impedance to a voltage source, or 2) is coupled by a medium impedance to the voltage source, or 3) is floating or substantially floating. The circuit asserts a first digital logic signal when the circuit determines that the terminal is coupled by the low impedance to the voltage source. The circuit asserts a second digital logic signal when the circuit determines that the terminal is coupled by the medium impedance to the voltage source. The circuit asserts a third digital logic signal when the circuit determines that the terminal is floating or substantially floating.

In one embodiment, the integrated circuit is a power management unit (PMU) that outputs supply voltages to a central processing unit (CPU). The input terminal is coupled by a low impedance to the voltage source when a first input switch A is closed. The input terminal is coupled by a medium impedance to the voltage source when a second input switch B is closed. The input terminal is floating when no input switch is closed. A circuit within the PMU detects whether switch A and/or switch B is either open or closed and determines one of the three states of the terminal. In response, the circuit asserts a first digital logic signal to reset the CPU when switch A is closed; the circuit asserts a second digital logic signal to enable/disable the CPU when only switch B is closed; and the circuit asserts a third digital logic signal and remains in an idle state when neither switch A nor switch B is closed. In one example, the voltage source is a digital logic low voltage source (GND). In another example, the voltage source is a digital logic high voltage source (VDD).

By employing the novel single input terminal, the number of terminals of the integrated circuit can be reduced. Reducing the number of terminals reduces manufacturing cost of a device (for example, a cellular telephone) that employs the integrated circuit. Furthermore, the circuit within the integrated circuit is a simple circuit; it not only detects the states of multiple input switches, but also prioritizes among the multiple input switches. Finally, when no input switch is closed, the circuit operates in a zero-quiescent current state and reduces power consumption.

Other structures and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 3A is a diagram of a cellular telephone 11 including a novel PMU integrated circuit 14 in accordance with one novel aspect.

FIG. 3B is a diagram of a cellular telephone 21 including a novel PMU integrated circuit 24 in accordance with one novel aspect.

FIG. 4 is a table that illustrates how a single input terminal of a novel PMU integrated circuit is usable to configure a cellular telephone.

FIG. 5 is a simplified block diagram that illustrates a circuit inside the novel PMU integrated circuit 14 of FIG. 3A.

FIG. 6 illustrates a first embodiment of a circuit 21 inside PMU integrated circuit 14.

FIG. 7 is a table that sets forth the three states (Q0, Q1 and Q2) of operation of circuit 40 of FIG. 6. The table also sets forth the corresponding functions performed by PMU integrated circuit 14 in each of the three states.

DETAILED DESCRIPTION

Figures 1, 2:
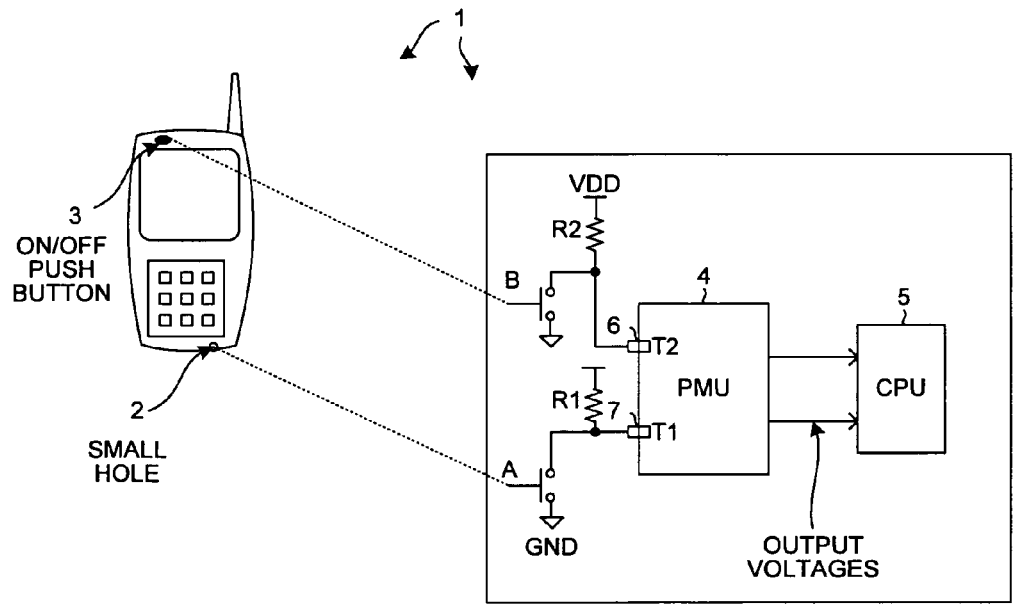
FIG. 1 (prior art) is a simplified diagram of a conventional Power Management Unit (PMU) integrated circuit in a cellular telephone.
FIG. 2 (prior art) is a table that illustrates how digital signals on two terminals of the conventional PMU integrated circuit configure the cellular telephone of FIG. 1.

Reference will now be made in detail to some embodiments of the invention, examples of which are illustrated in the accompanying drawings.

FIG. 3A is a simplified diagram of a cellular telephone 11 having a novel power management unit (PMU) integrated circuit 14 and a central processing unit (CPU) 15 in accordance with one novel aspect. Cellular telephone 11 includes a small hole 12 and an ON/OFF push button 13. PMU 14 includes a single input terminal 16 (T1). Small hole 12 contains a switch A that couples terminal T1 of PMU 14 to a digital logic low voltage GND when switch A is closed. ON/OFF push button 13 controls a switch B that couples the same terminal T1 of PMU 14 by external resistor $R_{EXT}$ to GND when switch B is closed. During normal operation, PMU 14 outputs supply voltages to CPU 15. PMU 14 also detects a digital input signal IN from terminal T1 and in response performs corresponding functions. For example, as described below in more detail, a user of cellular telephone 11 may either close switch A (by pressing switch A inside small hole 12) to reset CPU 15 of the cellular telephone, or close switch B (by pushing ON/OFF push button 13) to either enable or disable CPU 15 of the cellular telephone.

FIG. 3B is a simplified diagram of a cellular telephone 21 having a novel PMU integrated circuit 24 and a CPU 25 in accordance with one novel aspect. Cellular telephone 21 of FIG. 3B is similar to cellular telephone 11 of FIG. 3A. In FIG. 3B, however, switch A is controlled by ON/OFF push button 23 while switch B is replaced by a direct closed-loop control line 29. In the example of FIG. 3B, terminal T1 is coupled by $R_{EXT}$ to a GPIO terminal of CPU 25.

FIG. 4 is a table 30 that illustrates how a single input terminal T1 of PMU integrated circuit 14 of FIG. 3A is usable to configure cellular phone 11. If switch A is pushed close, then T1 is "tied low" or in other words is coupled to a digital logic low voltage GND by a short or a relatively low impedance. Terminal T1 is then said to be in a digital logic low state of "0". PMU 14 detects this "0" state and asserts a first digital logic signal to reset CPU 15. If switch A is released but switch B is pushed close, then T1 is coupled to the digital logic low voltage GND by a relatively medium impedance $R_{EXT}$. This medium impedance state is denoted "R" in table 30 of FIG. 4. PMU 14 detects this "R" state and asserts a second digital logic signal either to enable CPU 15 (if CPU 15 is previously disabled) or to disable CPU 15 (if CPU 15 is previously enabled). If both switches A and B are released, then terminal T1 is said to be in a state of "floating or substantially floating". PMU 14 detects this "floating" state and asserts a third digital logic signal. Typically, PMU 14 simply remains idle in this "floating" state.

In the above illustrated example, PMU 14 is capable of detecting one of the three states of a single input terminal T1 and in response performing a predetermined function associated with the detected state. By employing the novel single input terminal T1 as compared to two input terminals (for instance, terminals T1 and T2 as illustrated in FIG. 1), the number of terminals of an integrated circuit can be reduced in many applications. Reducing the number of terminals reduces manufacturing cost of a device (for example, a cellular telephone) that employs the integrated circuit.

FIG. 5 is a simplified block diagram that illustrates an example of how PMU 14 of FIG. 3A can be implemented in order to detect one of the three states of input terminal T1. Circuit 21 of PMU 14 includes an electronic component 22 and a detection circuit 23. In the example of FIG. 5, component 22 is either a pull-up resistor R1 or a current source $I_{SOURCE}$ that couples terminal T1 to a supply voltage VDD. Detection circuit 23 receives the digital input signal IN from terminal T1 and determines one of the three states: Q0, Q1, or Q2. More specifically, detection circuit 23 determines: 1) whether terminal T1 is coupled to a digital logic low voltage by a relatively low impedance (this is called state Q0), or 2) whether terminal T1 is coupled to a digital logic low voltage by a relatively medium impedance (this is called state Q1), or 3) whether terminal T1 is floating or substantially floating (this is called state Q2).

FIG. 6 is a block diagram of a circuit 40 that illustrates a first embodiment of circuit 21 of FIG. 5. In the embodiment of FIG. 6, circuit 40 includes a pull-up resistor 31 (R1), a P-channel field effect transistor (PFET) 32 having a threshold voltage VTH, an inverter 34, a comparator 35, and a decode logic circuit 36. Pull-up resistor 31 couples terminal T1 to supply voltage VDD. PFET 32 has a gate that is coupled to terminal T1, a source that is coupled to supply voltage VDD, and a drain that is coupled by resistor 33 to GND. The drain of PFET 32 is also coupled to an input lead of inverter 34. Inverter 34 outputs a first digital signal X onto a first input lead of decode logic circuit 36. Comparator 35 has a non-inverting input lead that is coupled to terminal T1, and an inverting input lead that is coupled to a reference voltage VREF. VREF is higher than GND but lower than VDD. Comparator 35 outputs a second digital signal Y onto a second input lead of decode logic circuit 36. Decode logic circuit 36 receives the two digital signals X and Y and decodes them into three possible states: Q0, Q1 and Q2.

FIG. 7 is a table 50 that sets forth the three states (Q0, Q1 and Q2) of operation of circuit 40 of FIG. 6. The table also sets forth the corresponding functions performed by PMU integrated circuit 14 in each of the three states. As explained earlier in connection with table 30 of FIG. 4, in a first scenario, if switch A is pushed close, then T1 is coupled to GND by a relatively low impedance. Terminal T1 is said to be in a digital logic low state of "0". Terminal T1 therefore has a voltage that is lower than both the threshold voltage VTH of PFET 32 and the reference voltage VREF of comparator 35. As a result, PFET 32 becomes conductive and inverter 34 outputs signal X with a digital logic low value (X=0). In addition, comparator 35 outputs signal Y with a digital logic low value (Y=0). Decode logic circuit 36 receives the states of X=0 and Y=0 and decodes such states into "state Q0". Accordingly, PMU 14 asserts a first digital logic signal to reset CPU 15.

In a second scenario, if switch A is released but switch B is pushed close, then T1 is coupled to GND by a relatively medium impedance $R_{EXT}$. Terminal T1 is said to be in a medium impedance state of "R". In one example, the voltage on terminal T1 is lower than the threshold voltage VTH but is higher than the reference voltage VREF. As a result, PFET 32 becomes conductive and inverter 34 outputs signal X with a digital logic low value (X=0). In addition, comparator 35 outputs signal Y with a digital logic high value (Y=1). Decode logic circuit 36 receives the states of X=0 and Y=1 and decodes such states into "state Q1". Accordingly, PMU 14 asserts a second digital logic signal to enable/disable CPU 15.

In a third scenario, if both switches A and B are released, then T1 is said to be "floating". In this floating state, the voltage on terminal T1 is pulled up internally by circuit 40 through pull-up resistor R1 to a digital logic high voltage. The voltage on terminal T1 is therefore higher than both the threshold voltage VTH and the reference voltage VREF. As a result, PFET 32 remains non-conductive and inverter 34 outputs signal X with a digital logic high value (X=1). In addition, comparator 35 outputs signal Y with a digital logic high value (Y=1). Decode logic circuit 36 receives the states of X=1 and Y=1 and decodes such states into "state Q2". Accordingly, PMU 14 asserts a third digital logic signal. During normal operation, circuit 40 of PMU 14 typically operates in this Q2 state and remains idle because neither input switches are pushed.

As illustrated in FIG. 6, in an alternative implementation, comparator 35 is replaced by circuitry 37. Circuitry 37 includes an N-channel field effect transistor (NFET) 38. NFET 38 has a gate that is coupled to terminal T1, a source that is coupled to GND, and a drain that is coupled by a resistor 41 (or other source of pull-up current, such as a current source or a second MOSFET) to supply voltage VDD. The drain of NFET 38 is also coupled by an inverter 42 to the second input lead of decode logic circuit 36. Circuitry 37 outputs digital signal Y based on the detected state of input terminal T1 in the same manner as comparator 35.

Employing the novel single input terminal 16 (T1) and circuit 40 of FIG. 6 not only reduces the number of input terminals, but also provides further advantages. First, circuit 40 of FIG. 6 is very simple. Although it is recognized that an analog-to-digital (A/D) converter could be employed to detect one of many discrete voltage levels of a voltage received on an input terminal, a multi-bit A/D converter generally requires a user to supply a D/A converter of similar resolution and accuracy in the integrated circuit that is used to drive the terminal. Second, circuit 40 of FIG. 6 not only detects the states of multiple input switches, but also prioritizes among the multiple input switches. In this particular example of FIG. 7, switch A has a higher priority over switch B because terminal T1 is said to be in state "0" as long as switch A is pushed regardless of whether switch B is pushed. This type of prioritization allows an important function (for example, a hardware reset) to be associated with the highest priority input switch. Third, circuit 40 of FIG. 6 remains idle when T1 is in the "floating" state where neither input switch A nor B is pushed. When T1 is floating, the supply current is reduced to essentially zero and circuit 40 operates in a zero-quiescent current state. This enables a portable device (for example, cellular telephone 11 of FIG. 3A) to reduce power consumption and extend battery life.

Figure 8:
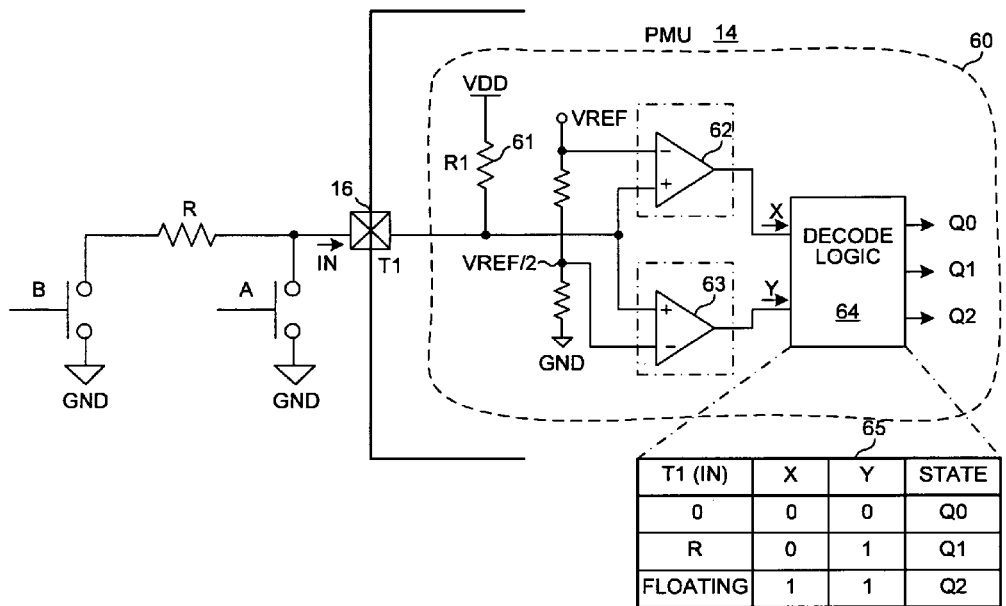
FIG. 8 is a second embodiment of circuit 21 within PMU integrated circuit 14.

FIG. 8 is a block diagram of a circuit 60 that illustrates a second embodiment of circuit 21 of FIG. 5. In the embodiment of FIG. 8, circuit 60 includes a pull-up resistor 61 (R1), a first comparator 62, a second comparator 63, and a decode logic circuit 64. Pull-up resistor 61 couples terminal T1 to supply voltage VDD. Comparator 62 has a non-inverting lead that is coupled to terminal T1, an inverting lead that is coupled to a first reference voltage VREF. Comparator 62 outputs a first digital signal X onto a first input lead of decode logic circuit 36. Comparator 63 has a non-inverting lead that is coupled to terminal T1, an inverting lead that is coupled to a second reference voltage (for instance, VREF/2 as illustrated in FIG. 8). Comparator 63 outputs a second digital signal Y onto a second input lead of decode logic circuit 36. If T1 is in state "0", then both comparators output signals with a digital logic low value; if T1 is in state "R" and the voltage on T1 is lower than VREF but higher than VREF/2, then comparator 62 outputs signal X with a digital logic low value and comparator 63 outputs signal Y with a digital logic high value; if T1 is in state "floating" and has a relatively high voltage, then both comparators output signals with a digital logic high value. Table 65 of FIG. 8 illustrates how decode logic circuit 64 receives the two digital signals X and Y and decodes them into three possible states of Q0, Q1 and Q2.

For similar reasons as set forth above in connection with comparator 35 of FIG. 6, comparator 62 or comparator 63 of FIG. 8 is also replaceable by an NFET having a gate that is coupled to terminal T1, a source that is coupled to GND and a drain that is coupled by a pull-up resistor (or other source of pull-up current, such as a current source or a second MOSFET) to supply voltage VDD. The threshold voltage of the NFET is adjustable by sizing the transistor and the pull-up resistor properly.

Figure 9:
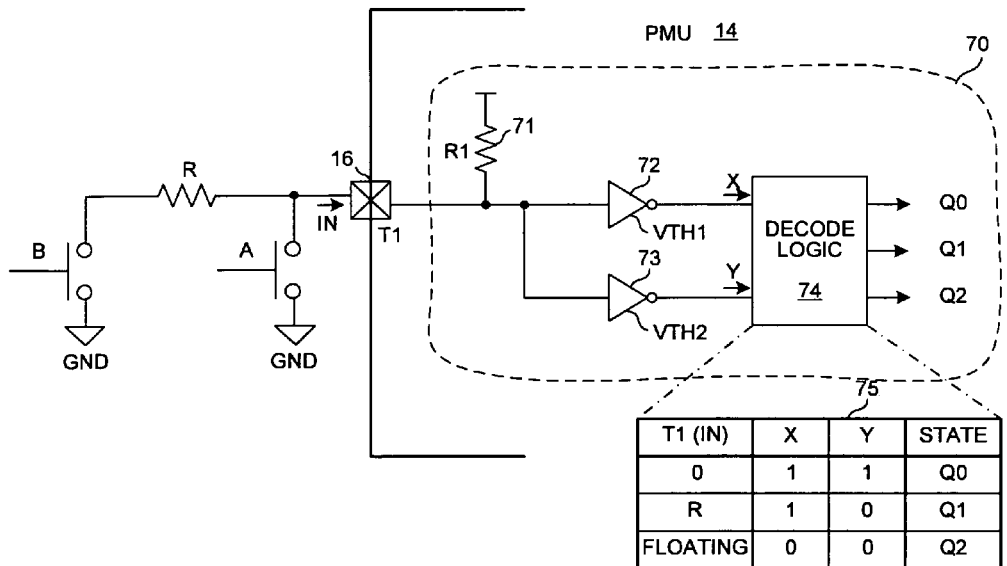
FIG. 9 is a third embodiment of circuit 21 within PMU integrated circuit 14.

FIG. 9 is a block diagram of a circuit 70 that illustrates a third embodiment of circuit 21 of FIG. 5. In the embodiment of FIG. 9, circuit 70 includes a pull-up resistor 71 (R1), a first inverter 72, a second inverter 73, and a decode logic circuit 74. Pull-up resistor 71 couples terminal T1 to supply voltage VDD. Inverter 72 receives input signal IN from terminal T1 and outputs a first digital signal X onto a first input lead of decode logic circuit 74. Inverter 73 receives input signal IN from terminal T1 and outputs a second digital signal Y onto a second input lead of decode logic circuit 74. Inverter 72 has a threshold voltage of VTH1 that is higher than a threshold voltage VTH2 of inverter 73. If T1 is tied low in state "0", then both inverters output signals with a digital logic high value; if T1 is in state "R" and the voltage on T1 is lower than VTH1 but higher than VTH2, then inverter 72 outputs signal X with a digital logic high value and inverter 73 outputs signal Y with a digital logic low value; if T1 is in state "floating" and has a relatively high voltage, then both inverters output signals with a digital logic low value. Table 75 of FIG. 9 illustrates how decode logic circuit 74 receives the two digital signals X and Y and decodes them into three possible states of Q0, Q1 and Q2.

Figures 10, 11:
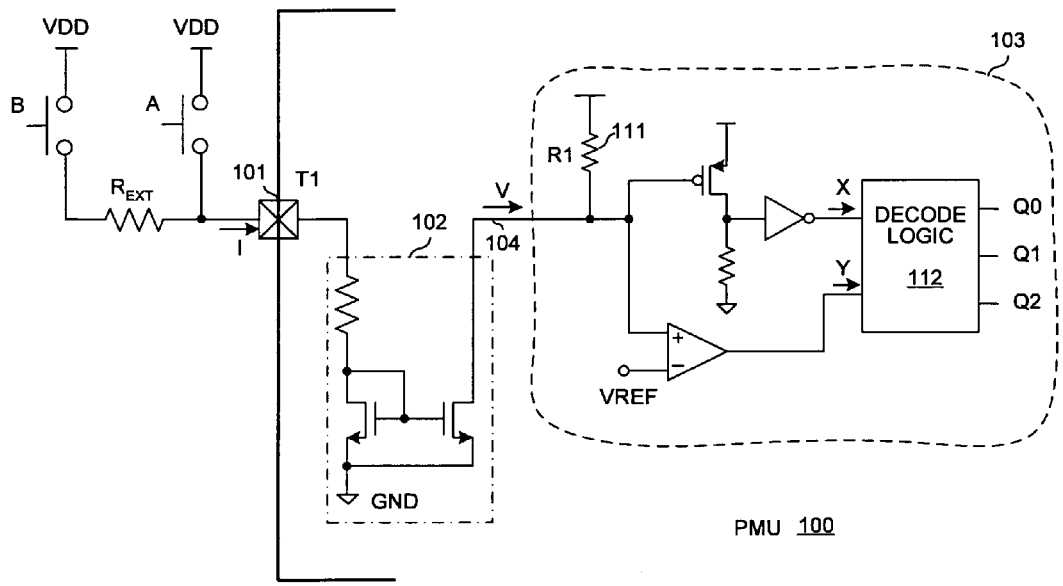
FIG. 10 illustrates a novel PMU integrated circuit 100 in accordance with one novel aspect.
FIG. 11 is a table that sets forth the three states (Q0, Q1 and Q2) of operation of circuit 101 of FIG. 10. The table also sets forth the corresponding functions performed by PMU integrated circuit 100 in each of the three states.

FIG. 10 illustrates a novel PMU integrated circuit 100 in accordance with one novel aspect. PMU 100 includes a single input terminal 101 (T1), a current source 102, and a circuit 103. Circuit 103 of FIG. 10 is substantially the same as circuit 40 of FIG. 6. In the example of FIG. 6, switches A and B couple terminal T1 to a digital logic low voltage either directly or through an external resistor. In the example of FIG. 10, however, switch A couples terminal T1 to a digital logic high voltage (VDD) when switch A is closed, and switch B couples terminal T1 by an external resistor $R_{EXT}$ to the digital logic high voltage VDD when switch B is closed. Current source 102 functions as a current mirror and converts a current I that flows through terminal T1 to a signal V on an internal node 104. After such conversion, node 104 is equivalent to terminal T1 of FIG. 6 with respect to circuit 40 of FIG. 6. Circuit 103 receives signal V on node 104 and determines one of the three states Q0, Q1, or Q2 in the same fashion as circuit 40 of FIG. 6.

FIG. 11 is a table that sets forth the three states (Q0, Q1 and Q2) of operation of circuits 102 and 103 of FIG. 10. For example, if switch A is pushed close, then T1 is "tied high" or in other words is coupled to a digital logic high voltage VDD by a short or a relatively low impedance. A relatively large current I flows through terminal T1. As a result, signal V is said to be in a digital logic low state of "0". If switch A is released but switch B is pushed close, then T1 is coupled to the digital logic high voltage VDD by a relatively medium impedance $R_{EXT}$. A medium current I flows through terminal T1. As a result, signal V is said to be in the medium impedance state of "R". If both switches A and B are released, then T1 is "floating or substantially floating". A relatively small current I flows through terminal T1. As a result, signal V is said to be in a digital logic high state of "1". As explained earlier in connection with FIG. 6 and FIG. 7, circuit 103 determines one of the three states (Q0, Q1, or Q3) and PMU 100 asserts a digital corresponding logic signal to either reset a CPU, or enable/disable a CPU.

Figure 12:
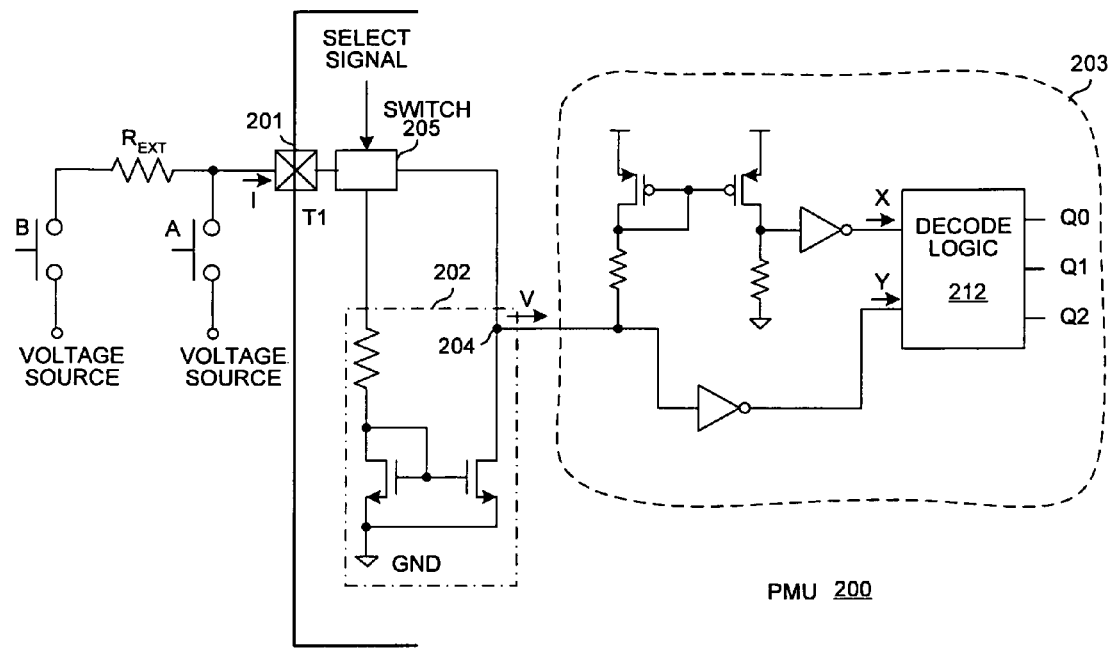
FIG. 12 illustrates a novel PMU integrated circuit 200 in accordance with one novel aspect.

FIG. 12 illustrates a novel PMU integrated circuit 200 in accordance with one novel aspect. PMU 200 includes a single input terminal 201 (T1), a current source 202, and a circuit 203. Current source 202 and circuit 203 of FIG. 12 operate in a similar manner as current source 102 and circuit 103 of FIG. 10. In the example of FIG. 12, however, terminal T1 can be coupled to a voltage source that is either a digital logic low voltage source or a digital logic high voltage source. In one example, switch 205 is used to indicate whether a digital logic low voltage or a digital logic high voltage is selected. If a digital logic low voltage GND is selected, then switch 205 couples input terminal T1 to node 204 directly. On the other hand, if a digital logic high voltage VDD is selected, then switch 205 couples input terminal T1 to current source 202. Current source 202 functions as a current mirror and converts a current I that flows through terminal T1 to a signal V on node 204. In both cases, circuit 203 receives signal V on node 204 and determines one of the three states of Q0, Q1, or Q2.

Figure 13:
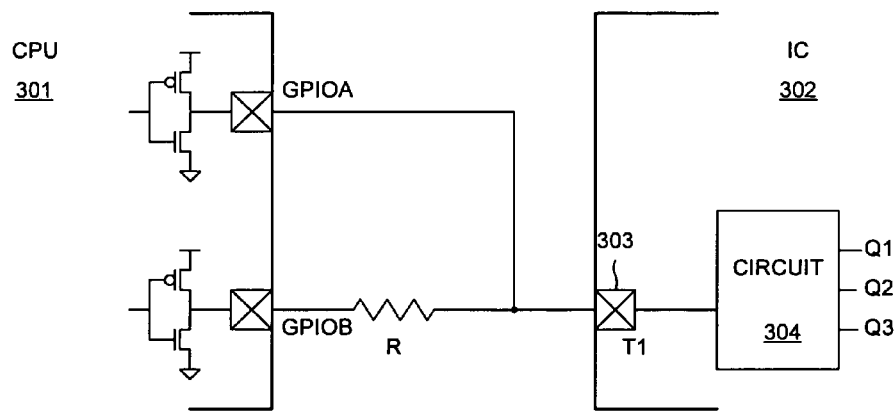
FIG. 13 is a diagram of an alternative way that a CPU can be coupled to a novel integrated circuit in accordance with one novel aspect.

FIG. 13 is a diagram of an alternative way that a CPU 301 can be coupled to a novel integrated circuit 302. CPU 301 includes two terminals GPIOA and GPIOB. Integrated circuit 302 includes a single input terminal 303 (T1) and a circuit 304. Terminal T1 and circuit 304 of FIG. 13 are similar to terminal T1 and circuit 21 of FIG. 5. In the example of FIG. 13, however, Terminal T1 is coupled to GPIOA. Terminal T1 is also coupled by a resistor R to GPIOB. Terminal T1 has multiple states because CPU 301 outputs different signals onto terminals GPIOA and GPIOB. Circuit 304 detects one of those multiple states of terminal T1 and asserts a digital logic signal indicative of the detected state. In addition, circuit 304 may perform a predetermined function associated with the asserted digital logic signal. Therefore, the illustrated novel single input terminal and circuit of an integrated circuit can be employed not only to interface with user-interface applications (such as input switches A and B of FIG. 5), but also to interface with another integrated circuit (such as CPU 301 of FIG. 13).

Although the present invention is described in connection with certain specific embodiments for instructional purposes, the present invention is not limited thereto. For example, the illustrated single input terminal integrated circuit of FIG. 3A is not limited to a power management unit, and the performed functions associated with the asserted digital logic signals illustrated in FIG. 4 are not limited to either reset, or enable/disable, or remain in an idle state. Furthermore, the detection of three input states on a single terminal may be extended to the detection of more than three input states on a single input terminal. Accordingly, various modifications, adaptations, and combinations of various features of the described embodiments can be practiced without departing from the scope of the invention as set forth in the claims.

What is claimed is:

1. An integrated circuit comprising:
    a terminal; and
    a circuit that determines whether the terminal is coupled external to the integrated circuit by a low impedance to a voltage source, or whether the terminal is coupled external to the integrated circuit by a medium impedance to the voltage source, or whether the terminal is floating or substantially floating, wherein a voltage on the terminal is lower than a first threshold voltage but higher than a second threshold voltage when the terminal is coupled by the medium impedance to the voltage source, wherein the circuit asserts a first digital logic signal if the circuit determines that the terminal is coupled by the low impedance to the voltage source, wherein the circuit asserts a second digital logic signal if the circuit determines that the terminal is coupled by the medium impedance to the voltage source, and wherein the circuit asserts a third digital logic signal if the circuit determines that the terminal is floating or substantially floating.

2. The integrated circuit of claim 1, wherein the voltage source is a low logic level voltage source.

3. The integrated circuit of claim 1, wherein the voltage source is a high logic level voltage source.

4. The integrated circuit of claim 1, wherein the integrated circuit is a power management unit (PMU), and wherein the PMU provides a supply voltage to a CPU.

5. The integrated circuit of claim 4, wherein the CPU is reset if the PMU asserts the first logical signal, wherein the CPU is either enabled or disabled if the PMU asserts the second logical signal, and wherein the PMU remains idle if the PMU asserts the third logical signal.

6. The integrated circuit of claim 1, wherein a larger current flows out of the terminal when the terminal is coupled by the low impedance to the voltage source, wherein a medium current flows out of the terminal when the terminal is coupled by the medium impedance to the voltage source, and wherein a small current flows out of the terminal when the terminal is floating or substantially floating.

7. The integrated circuit of claim 1, wherein the circuit comprises:
    a component that couples the terminal to a supply voltage, wherein the component is taken from the group consisting of: a pull-up resistor, and a current source;
    a decode logic circuit having a first input lead and a second input lead, wherein the decode logic circuit outputs the first, second, or third logical signal;
    a P-channel field effect transistor (PFET) having a source, a gate and a drain, the gate is coupled to the terminal, the source is coupled to a supply voltage, the drain is coupled by an inverter to the first input lead of the decode logic circuit; and
    a comparator, wherein a first input lead of the comparator is coupled to the terminal, wherein a second input lead of the first comparator is coupled to a reference voltage, and wherein an output lead of the comparator is coupled to the second input lead of the decode logic circuit.

8. The integrated circuit of claim 1, wherein the circuit comprises:
    a component that couples the terminal to a supply voltage, wherein the component is taken from the group consisting of: a pull-up resistor, and a current source;
    a decode logic circuit having a first input lead and a second input lead, wherein the decode logic circuit outputs the first, second, or third logical signal;
    a P-channel field effect transistor (PFET) having a source, a gate and a drain, the gate is coupled to the terminal, the source is coupled to a supply voltage, the drain is coupled by an inverter to the first input lead of the decode logic circuit; and an N-channel field effect transistor (NFET) having a source, a gate and a drain, the gate is coupled to the terminal, the source is coupled to ground, the drain is coupled to the second input lead of the decode logic circuit.

9. An integrated circuit comprising:

a terminal; and a circuit that determines whether the terminal is coupled external to the integrated circuit by a low impedance to a voltage source, or whether the terminal is coupled external to the integrated circuit by a medium impedance to the voltage source, or whether the terminal is floating or substantially floating, wherein the circuit asserts a first digital logic signal if the circuit determines that the terminal is coupled by the low impedance to the voltage source, wherein the circuit asserts a second digital logic signal if the circuit determines that the terminal is coupled by the medium impedance to the voltage source, wherein the circuit asserts a third digital logic signal if the circuit determines that the terminal is floating or substantially floating, and wherein the circuit comprises:

a component that couples the terminal to a supply voltage, wherein the component is taken from the group consisting of: a pull-up resistor, and a current source;

a decode logic circuit having a first input lead and a second input lead, and wherein the decode logic circuit outputs the first, second, or third logical signal;

a first comparator, wherein a first input lead of the first comparator is coupled to the terminal, wherein a second input lead of the first comparator is coupled to a reference voltage, and wherein an output lead of the first comparator is coupled to the first input lead of the decode logic circuit; and a second comparator, wherein a first input lead of the second comparator is coupled to the terminal, wherein a second input lead of the second comparator is coupled to a fraction of the reference voltage, and wherein an output lead of the second comparator is coupled to the second input lead of the decode logic circuit.

10. The integrated circuit of claim 9, wherein the first comparator is replaceable by a first N-channel field effect transistor (NFET) having a higher threshold voltage, wherein the second comparator is replaceable by a second NFET having a lower threshold voltage.

11. An integrated circuit comprising:

a terminal; and a circuit that determines whether the terminal is coupled external to the integrated circuit by a low impedance to a voltage source, or whether the terminal is coupled external to the integrated circuit by a medium impedance to the voltage source, or whether the terminal is floating or substantially floating, wherein the circuit asserts a first digital logic signal if the circuit determines that the terminal is coupled by the low impedance to the voltage source, wherein the circuit asserts a second digital logic signal if the circuit determines that the terminal is coupled by the medium impedance to the voltage source, wherein the circuit asserts a third digital logic signal if the circuit determines that the terminal is floating or substantially floating, and wherein the circuit comprises:

a component that couples the terminal to a supply voltage, wherein the component is taken from the group consisting of: a pull-up resistor, and a current source;

a decoded logic circuit having a first input lead and a second input lead, wherein the decode logic circuit outputs the first, second, or third logical signal;

a first inverter, wherein an input lead of the first inverter is coupled to the terminal, wherein an output lead of the first inverter is coupled to the first input lead of the decode logic circuit; and a second inverter, wherein an input lead of the second inverter is coupled to the terminal, wherein an output lead of the second inverter is coupled to the second input lead of the decode logic circuit, and wherein a threshold voltage of the second inverter is lower than a threshold voltage of the first inverter.

12. A method comprising:

(a) determining whether a terminal of an integrated circuit is coupled external to the integrated circuit by a low impedance to a voltage source, or whether the terminal is coupled external to the integrated circuit by a relatively medium impedance to the voltage source, or whether the terminal is floating or substantially floating, wherein a voltage on the terminal is lower than a first threshold voltage but higher than a second threshold voltage when the terminal is coupled external to the integrated circuit by the relatively medium impedance to the voltage source, wherein the determinations of (a) are made by a circuit internal to the integrated circuit of which the terminal is a part;

(b) asserting a first digital logic signal if it is determined in (a) that the terminal is coupled external to the integrated circuit by a low impedance to the voltage source;

(c) asserting a second digital logic signal if it is determined in (a) that the terminal is coupled external to the integrated circuit by the relatively medium impedance to the voltage source; and (d) asserting a third digital logic signal if it is determined in (a) that the terminal is floating, wherein said asserting of (b), (c) and (d) is performed by the circuit internal to the integrated circuit.

13. The method of claim 12, wherein the voltage source is a low logic level voltage source.

14. The method of claim 12, wherein the voltage source is a high logic level voltage source.

15. The method of claim 12, wherein a larger current flows out of the terminal when the terminal is coupled by the low impedance to the voltage source, wherein a medium current flows out of the terminal when the terminal is coupled by the medium impedance to the voltage source, and wherein a small current flows out of the terminal when the terminal is floating or substantially floating.

16. An integrated circuit comprising:

a terminal;

means for determining (a) if the terminal is coupled external to the integrated circuit by a low impedance to a voltage source, or (b) if the terminal is coupled external to the integrated circuit by a relatively medium impedance to the voltage source, or (c) if the terminal is floating or substantially floating, wherein a voltage on the terminal is lower than a first threshold voltage but higher than a second threshold voltage if the terminal is coupled external to the integrated circuit by the relatively medium impedance to the voltage source, wherein the means asserts a first digital logic signal if the means determines (a), wherein the means asserts a second digital logic signal if the means determines (b), and wherein the means asserts a third digital logic signal if the means determines (c).

17. The integrated circuit of claim 16, wherein the voltage source is a low logic level voltage source.

18. The integrated circuit of claim 16, wherein the voltage source is a high logic level voltage source.

19. An integrated circuit comprising:
a terminal;
means for determining (a) if the terminal is coupled external to the integrated circuit by a low impedance to a voltage source, or (b) if the terminal is coupled external to the integrated circuit by a relatively medium impedance to the voltage source, or (c) if the terminal is floating or substantially floating, wherein the means asserts a first digital logic signal if the means determines (a), wherein the means asserts a second digital logic signal if the means determines (b), wherein the means asserts a third digital logic signal if the means determines (c), wherein the integrated circuit is a power management unit (PMU), and wherein the PMU provides a supply voltage to a CPU.

20. The integrated circuit of claim 19, wherein the CPU is reset if the PMU asserts the first logical signal, wherein the CPU is either enabled or disabled if the PMU asserts the second logical signal, and wherein the PMU remains idle if the PMU asserts the third logical signal.

21. An integrated circuit comprising:
a terminal; and
a circuit that determines whether the terminal is coupled external to the integrated circuit by a low impedance to a first voltage source, or whether the terminal is coupled external to the integrated circuit by a medium impedance to a second voltage source, or whether the terminal is floating or substantially floating, wherein a voltage on the terminal is lower than a first threshold voltage but higher than a second threshold voltage when the terminal is coupled external to the integrated circuit by the medium impedance to the second voltage source, wherein the circuit asserts a first digital logic signal if the circuit determines that the terminal is coupled by the low impedance to the first voltage source, wherein the circuit asserts a second digital logic signal if the circuit determines that the terminal is coupled by the medium impedance to the second voltage source, and wherein the circuit asserts a third digital logic signal if the circuit determines that the terminal is floating or substantially floating.

22. The integrated circuit of claim 21, wherein the first voltage source and the second voltage source are the same voltage source.

23. An integrated circuit comprising:
a terminal; and
a circuit that determines whether the terminal is coupled external to the integrated circuit by a low impedance to a first voltage source, or whether the terminal is coupled external to the integrated circuit by a medium impedance to a second voltage source, or whether the terminal is floating or substantially floating, wherein the circuit asserts a first digital logic signal if the circuit determines that the terminal is coupled by the low impedance to the first voltage source, wherein the circuit asserts a second digital logic signal if the circuit determines that the terminal is coupled by the medium impedance to the second voltage source, wherein the circuit asserts a third digital logic signal if the circuit determines that the terminal is floating or substantially floating, wherein the first voltage source and the second voltage source are the same voltage source, wherein the circuit is operable in a selectable one of a first mode and a second mode, wherein the voltage source is a digital logic low voltage source in the first mode, and wherein the voltage source is a digital logic high voltage source in the second mode.

24. The integrated circuit of claim 23, wherein the circuit comprises:
a current source, wherein in the second mode the current source receives an input signal from the terminal and in response outputs an internal signal; and
a detection circuit, wherein in the first mode the detection circuit receives the input signal from the terminal and in response outputs the first, second, or third digital logic signal, and wherein in the second mode the detection circuit receives the internal signal and in response outputs the first, second, or third digital logic signal.

* * * * *